United States Patent
Hsu et al.

(10) Patent No.: US 11,907,632 B2
(45) Date of Patent: Feb. 20, 2024

(54) AUTOMATED SCHEMATIC CHECK

(71) Applicant: QUANTA COMPUTER INC., Taoyuan (TW)

(72) Inventors: Kuo-Chan Hsu, Taoyuan (TW); Yun-Teng Shih, Taoyuan (TW); Shou-Fu Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 389 days.

(21) Appl. No.: 17/233,188

(22) Filed: Apr. 16, 2021

(65) Prior Publication Data

US 2022/0335188 A1    Oct. 20, 2022

(51) Int. Cl.
*G06F 30/3323* (2020.01)
*G06F 7/08* (2006.01)
*G06F 30/327* (2020.01)
*G06F 16/248* (2019.01)
*G06F 16/245* (2019.01)

(52) U.S. Cl.
CPC ............ *G06F 30/3323* (2020.01); *G06F 7/08* (2013.01); *G06F 16/245* (2019.01); *G06F 16/248* (2019.01); *G06F 30/327* (2020.01)

(58) Field of Classification Search
CPC ...... G06F 30/3323; G06F 7/08; G06F 16/245; G06F 16/248; G06F 30/327; G06F 30/30
USPC ........................................................ 716/103
See application file for complete search history.

(56) References Cited

U.S. PATENT DOCUMENTS

| | | | | |
|---|---|---|---|---|
| 2009/0313596 A1* | 12/2009 | Lippmann | ............. | G06F 30/327 716/126 |
| 2013/0047133 A1* | 2/2013 | Alam | ............. | G06F 30/30 716/136 |
| 2013/0144589 A1* | 6/2013 | Levi | ............. | G06F 30/33 703/14 |

FOREIGN PATENT DOCUMENTS

| | | |
|---|---|---|
| CN | 107563091 B | 3/2021 |
| TW | 200917077 A | 4/2009 |
| TW | 202113468 A | 4/2021 |

OTHER PUBLICATIONS

TW Office Action for Application No. 110141442, dated Jul. 14, 2022, w/ First Office Action Summary.
TW Search Report for Application No. 110141442, dated Jul. 14, 2022, w/ First Office Action.

* cited by examiner

*Primary Examiner* — Paul Dinh
(74) *Attorney, Agent, or Firm* — NIXON PEABODY LLP (57) ABSTRACT

A system includes one or more data processors and a non-transitory computer-readable storage medium containing instructions which, when executed on the one or more data processors, cause the one or more data processors to perform operations. The operations include receiving a design schematic, extracting keywords from the design schematic, and sorting the design schematic by the extracted keywords. The operations further include extracting a part number of a component from the sorted design schematic, comparing the component associated with the part number with a reference component associated with the part number, and displaying a result of the comparison indicating whether the component and the reference component match.

20 Claims, 6 Drawing Sheets

ADDR: {'PU1_2': ('23', 'MP5023GV00ABZ-MP5023GV-00AB-Z,A'), 'PR13_1': ('2', 'Q_RES_0402LF-2.49K,1%,1/16W,CHA')} EN: {'PU1_4': ('24', 'MP5023GV00ABZ-MP5023GV-00AB-Z,A'), 'PR2_3': ('2', 'Q_RES_0402LF-100K,1%,1/16W,CHIA'), 'PR1_2': ('1', 'Q_RES_0402LF-681K,1%,1/16W,CHIA'), 'PC1_1': ('1', 'Q_CAP_0402-1000PF,50V,5%,X7R,TA')}
IMON: {'PU1_5': ('22', 'MP5023GV00ABZ-MP5023GV-00AB-Z,A'), 'PR14_4': ('2', 'Q_RES_0402LF-30.1K'), 'PU1_3': ('9', 'MP5023GV00ABZ -MP5023GV-00AB-Z,A'), 'PR12_2': ('2', 'Q_RES_0402LF-4.7K,1%,1/16W,CHIA'), 'PC10_1': ('1', 'Q_CAP_0402-0.1UF,25V,10%,X7R,CA')}
ISET: {}

AUTOMATED SCHEMATIC CHECK

FIELD OF THE INVENTION

The present invention relates generally to verifying circuit designs, and more specifically, to automatically checking circuit schematics for errors.

BACKGROUND OF THE INVENTION

In typical circuit designs, a schematic drawing and design software is used to graphically represent and connect circuit components to create a circuit schematic. Circuit schematics can range from simple circuits directed at one system to complex circuits directed at multiple systems. In an example, a computer or server motherboard includes multiple systems that communicate with each other to perform tasks associated with the motherboard. Since complex circuits include multiple systems, schematic design for a complex circuit can be divided among multiple engineering teams. Each engineering team can be responsible for schematic design of a specific system within the multiple systems of the complex circuit. The schematic design of each specific system is then combined to represent the complex circuit. Errors can be introduced during the schematic design process. For example, while combining schematic of the multiple systems, two wires may be mistakenly connected together; two or more components may be mistakenly connected or left disconnected; etc. The present disclosure is directed at addressing problems associated with identifying errors in schematic design.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a system includes one or more data processors and a non-transitory computer-readable storage medium containing instructions which, when executed on the one or more data processors, cause the one or more data processors to perform operations. The operations include receiving a design schematic, extracting keywords from the design schematic, and sorting the design schematic by the extracted keywords. The operations further include extracting a part number of a component from the sorted design schematic, comparing the component associated with the part number with a reference component associated with the part number, and displaying a result of the comparison indicating whether the component and the reference component match.

In an implementation, the design schematic is a netlist file. The extracted keywords can include component pin names, component net names, component location, component specification, component description, component number of pins, or any combination thereof. In an implementation, the design schematic is sorted by pin name. In an implementation, the result is displayed in a spreadsheet or a comma-separated values (CSV) file. In an implementation, the result includes a pass or failed status for each pin in the sorted design schematic.

According to certain aspects of the present disclosure, a computer-implemented method includes receiving a design schematic, extracting keywords from the design schematic, and sorting the design schematic by the extracted keywords. The method further includes extracting a part number of a component from the sorted design schematic, comparing the component associated with the part number with a reference component associated with the part number, and displaying a result of the comparison indicating whether the component and the reference component match.

In an implementation, the design schematic is a netlist file. The extracted keywords can include component pin names, component net names, component location, component specification, component description, component number of pins, or any combination thereof. In an implementation, the design schematic is sorted by pin name. In an implementation, the result is displayed in a spreadsheet or a comma-separated values (CSV) file. In an implementation, the result includes a pass or failed status for each pin in the sorted design schematic.

According to certain aspects of the present disclosure, a computer-program product is provided. The computer-program product is tangibly embodied in a non-transitory machine-readable storage medium, including instructions configured to cause a data processing apparatus to perform operations. The operations include The operations include receiving a design schematic, extracting keywords from the design schematic, and sorting the design schematic by the extracted keywords. The operations further include extracting a part number of a component from the sorted design schematic, comparing a component associated with the part number with a reference component associated with the part number, and displaying a result of the comparison indicating whether the component and the reference component match.

In an implementation, the design schematic is a netlist file. The extracted keywords can include component pin names, component net names, component location, component specification, component description, component number of pins, or any combination thereof. In an implementation, the design schematic is sorted by pin name. In an implementation, the result is displayed in a spreadsheet or a comma separated values file. In an implementation, the result includes a pass or failed status for each pin in the sorted design schematic.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodi-

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Workflow for schematic design for a complex system (e.g., a motherboard) involves multiple steps. In a first step, a schematic drawing and design software are used to create a graphical representation of circuits included in the motherboard. In this step, circuit components within the circuit are abstracted and represented as symbols. Optionally, the graphical representation of the circuits can be converted to a text representation (e.g., a netlist file). In a second step, the schematic (in the text representation or in some cases the graphical representation) is exported to a printed circuit board (PCB) layout software for planning the layout of the complex circuit. The PCB layout software creates a Gerber file that includes a layout and routing of circuit components. The Gerber file can be provided to a PCB vendor for manufacturing.

Schematic check of complex circuits is typically performed manually. Schematic check can involve verifying or checking net names, chosen circuit components, circuit component specifications and descriptions, etc. Manually checking schematics is an expensive process, requiring extensive time and manpower in proportion to the complexity of the schematic being checked. If an error in schematic design (e.g., a motherboard schematic design) is not identified or caught, the manufactured circuit may not perform as expected. For example, in a motherboard, if wires are improperly connected or a chosen circuit component is not rated for an expected current or voltage, the motherboard may not boot properly or one or more circuit components may become damaged. Failures at the testing stage can cause delays in the project schedule, which can result in requiring additional money and manpower hours to debug and fix the motherboard.

Embodiments of the present disclosure provide systems and methods for performing automated schematic checks to catch errors well before the testing stage. Data analysis is performed on schematic information like net name, component name, component pin, component specification, etc., to determine whether there is an error in the schematic. Some advantages associated with some embodiments of the present disclosure include reducing circuit verification time associated with design of complex circuits, increased quality control associated with designed circuits, reduced human error in circuit schematics, etc.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
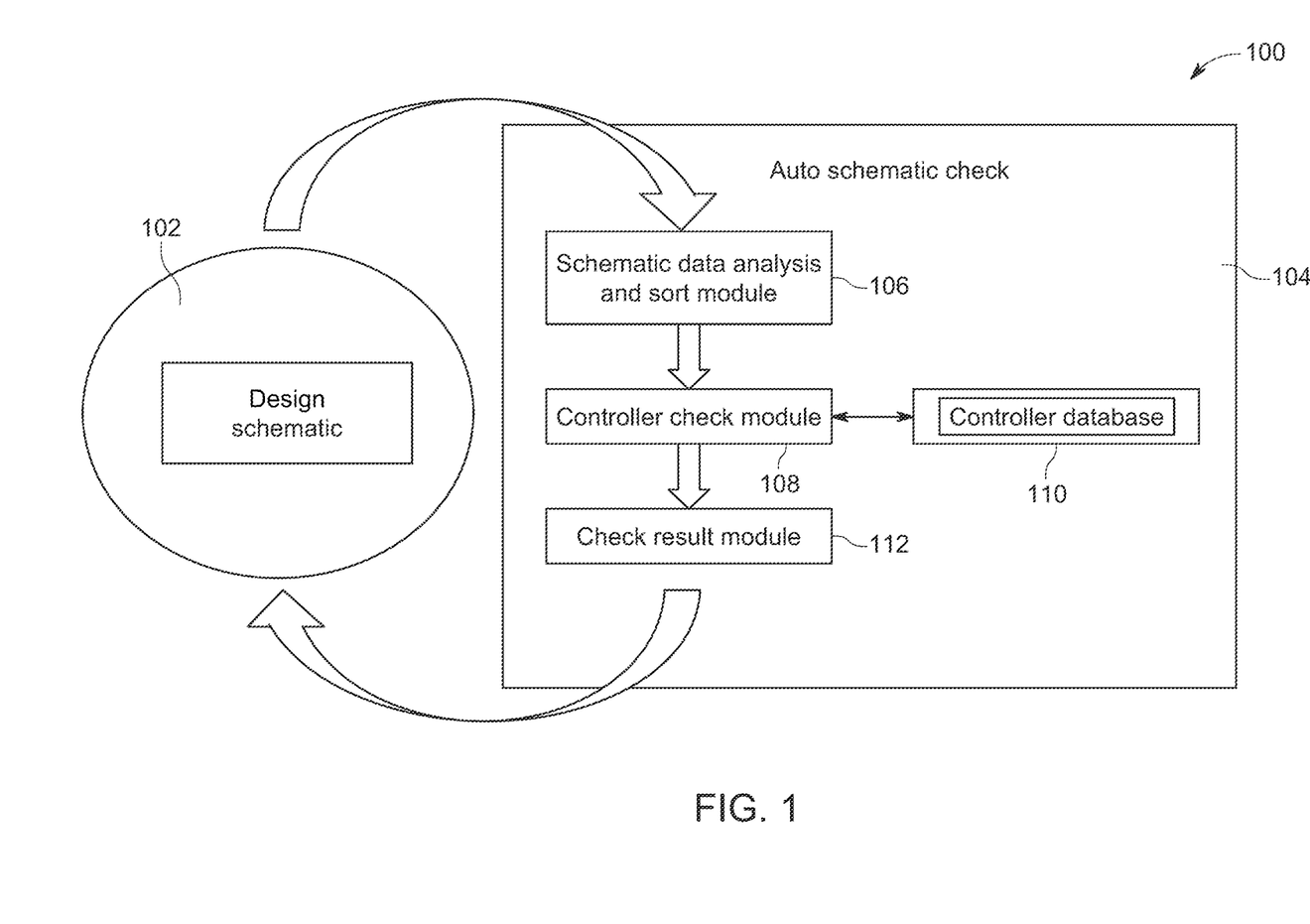
FIG. 1 is a system architecture for performing automated schematic checks, according to certain aspects of the present disclosure.

Referring to FIG. 1, a system architecture 100 for performing automated schematic checks is provided, according to certain aspects of the present disclosure. The system architecture 100 indicates information flow in a computing system that can include one or more processors and computer memories. The system architecture 100 includes a design schematic 102 and an automatic schematic check engine 104. An engine is a combination of hardware and software for performing associated tasks as described. The automatic schematic check engine 104 flags potential errors that may be present in the design schematic 102.

The design schematic 102 includes one or more files that describes connections between circuit components. The design schematic 102 includes a netlist or schematic file which can be provided in different formats, e.g., .net, .xml, etc. The design schematic 102 can be provided by a schematic design software. The design schematic 102 can be stored in a database, an internal or external storage of a computing system, etc. The design schematic 102 can include hundreds of schematic files.

The automatic schematic check engine 104 includes a schematic data analysis and sort engine 106, a controller check engine 108, a controller database 110, and a check result engine 112. The automatic schematic check engine 104 receives the design schematic 102 which includes schematic information (e.g., net name, component name, component pin, etc.). The automatic schematic check engine 104 then formats the design schematic 102 to find a part number associated with the controller check engine 108. The design schematic 102 is then checked with reference in the controller database 110. The check result engine 112 provides an indication of whether there is an error in the design schematic 102.

The schematic data analysis and sort engine 106 sorts schematic information contained in the design schematic 102. In some implementations, the schematic information is sorted by page, and components can be sorted by pin name associated with a component. All components have a net name, a location name, a component specification, a component description, and a number of pins.

The controller check engine 108 checks chosen components and net connections of the controller. In some implementations, the part number of the controller in the design schematic 102 is used to import a reference design from the controller database 110. The controller check engine 108 then checks component name, component specification, component description, component pin number, and component part number for each pin of the controller against the reference design obtained from the controller database 110.

The controller database 110 is a repository for reference controller designs. A reference design includes component net name, component specification, component description, component pin number of each pin controller connection, etc. The controller database 110 can include multiple reference designs and can be expanded as needed. Thus, a company design complex circuits can expand upon the different reference designs included in the controller database 110.

The check result engine 112 exports results from the controller check engine 108 for easier identification of errors in the design schematic 102. For example, the results can be exported into a spreadsheet file. The results can include component net name, component specification, component description, component pin number, and component number of all controller pins.

Figure 2:
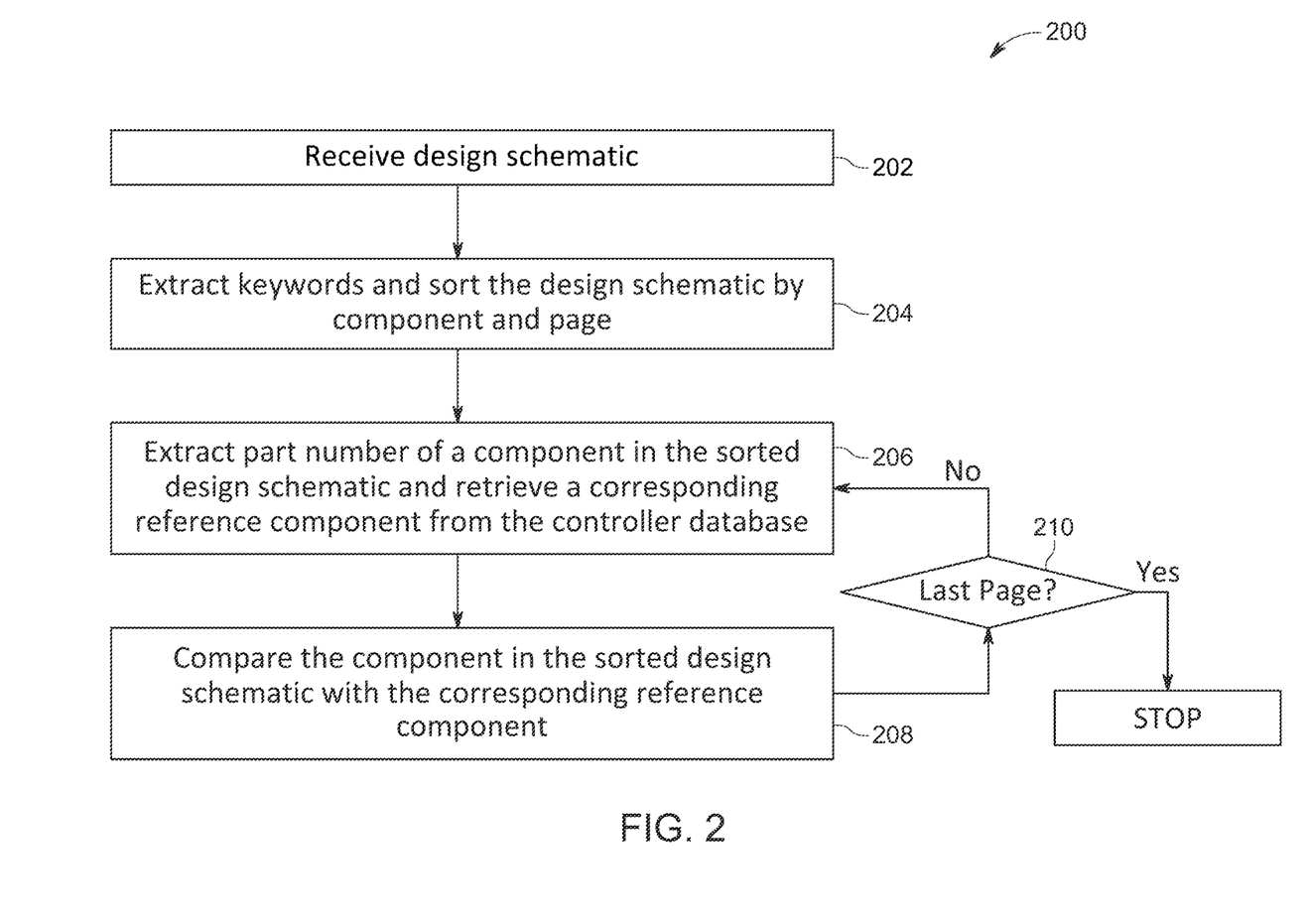
FIG. 2 is a flow diagram illustrating steps for performing automated schematic checks, according to certain aspects of the present disclosure.

FIG. 2 is a flow diagram illustrating a process 200 for performing automated schematic checks using the system architecture 100 of FIG. 1, according to certain aspects of the present disclosure. At step 202, the schematic data analysis and sort engine 106 of the automatic schematic check engine 104 receives the design schematic 102. The design schematic 102 can be exported from a schematic design software as a text or netlist file and provided to the schematic data analysis and sort engine 106.

At step 204, the schematic data analysis and sort engine 106 extracts keywords and sorts the design schematic 102 by component and page. Each component can have at least one net name, location name, component specification, component description, component pin number, etc. The design schematic 102 for complex circuits can include hundreds of schematic files spanning multiple pages. In some implementations, the extracted keywords are related to specific circuit components of interest. For example, simple components like inductors, capacitors, and resistors are not of interest and are skipped, and more complex components like controllers are more of interest and extracted. The design schematic 102 is sorted based at least in part on the extracted complex components. Sorting the design schematic 102 based on specific circuit components of interest facilitates quickly searching and identifying errors associated with those specific circuit components. In some implementations, the design schematic 102 is sorted based on pin names of the components.

At step 206, the controller check engine 108 extracts a part number of a component in the sorted design schematic 102 and retrieves a corresponding reference component from the controller database 110 using the extracted part number. The controller database 110 includes reference components of each of the circuit components of interest. Each reference component includes, for example, required pins of the reference component, net names associated with the reference component, component specification associated with the reference component, etc. The controller database 110 can organize reference components by part number such that an extracted part number of a component in the sorted design schematic 102 can be used to retrieve the appropriate reference component in the controller database 110. The controller database 110 can be expanded to include new reference products or new reference circuit components over time.

At step 208, the controller check engine 108 compares the component in the sorted design schematic 102 with the corresponding reference component. For example, the controller check engine 108 can compare net names, component specification, component description, component number of pins, etc., to determine whether the design schematic 102 includes any errors. Any mismatches between the design schematic 102 and the reference components are flagged.

At step 210, the controller check engine 108 determines whether the last page of the sorted design schematic 102 is reached. That is, the controller check engine 108 determines whether all components of interest have been checked. If all components of interest have been checked, then the process 200 stops. If all components of interest have not been checked, then a next part number is extracted at step 206.

In some implementations, after the process 200 stops, results of the automated schematic check is provided or displayed. Circuit components that were checked by the automatic schematic check engine 104 and corresponding match and/or mismatch results can be listed in a spreadsheet, comma-separated value (CSV) file, or some other structured document. The results can include net name, component specification, component description, component pin number, etc.

Figure 3:
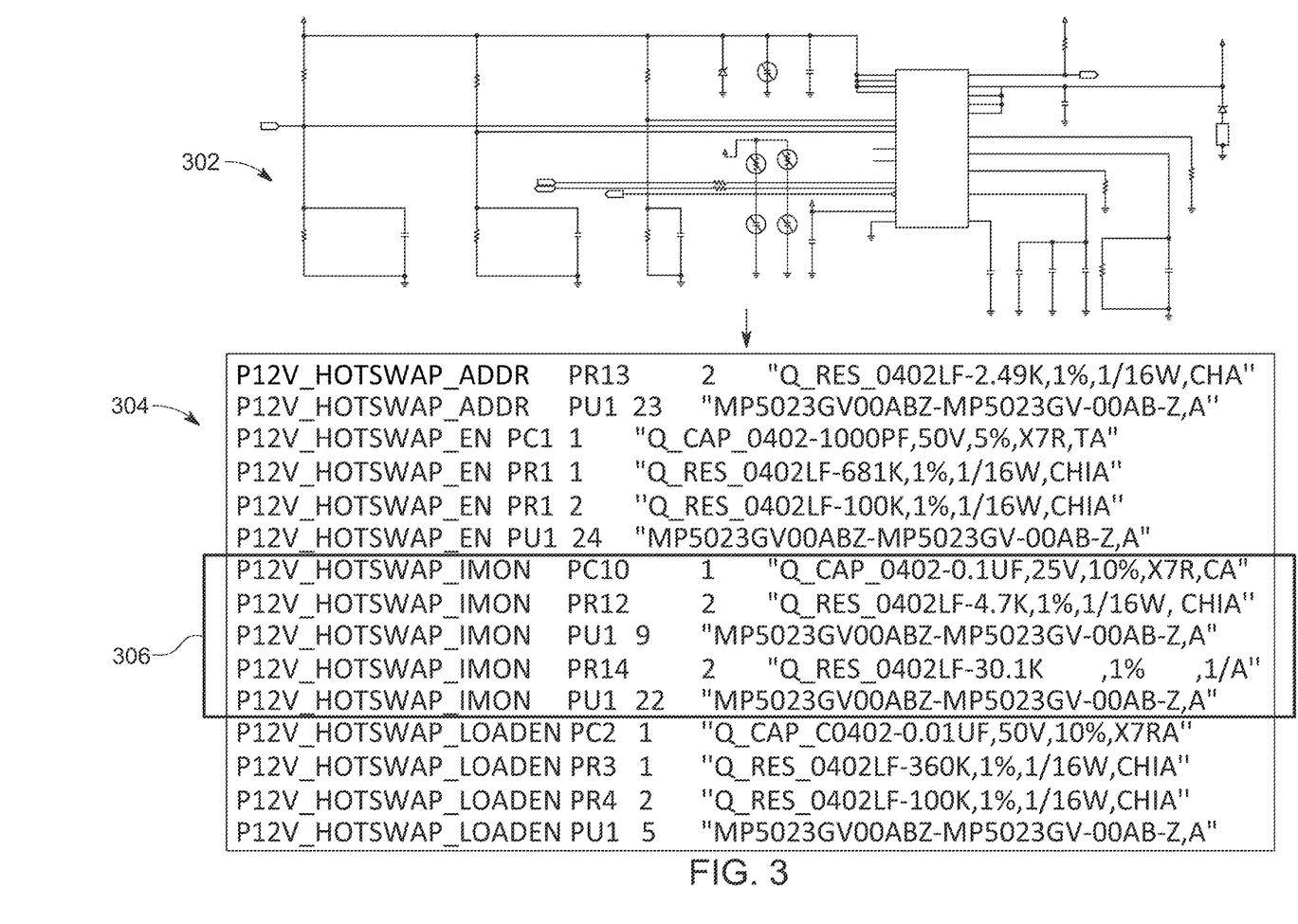
FIG. 3 illustrates a process of converting a schematic from a graphical form to a text form, according to certain aspects of the present disclosure.

The process 200 of FIG. 2 is illustrated using the example in FIGS. 3 to 6. FIG. 3 illustrates exporting a graphical schematic 302 to a schematic netlist file 304 for use in the process 200. The netlist file 304 is received by the schematic data analysis and sort engine 106 at step 202 (FIG. 2). The netlist file 304 provides raw data by listing component information in a native manner as generated by exporting the graphical schematic 302. A component wire or pin of interest IMON 306 is highlighted in the netlist file 304 for this specific example. Properties of the component pin IMON 306 can be displayed in the format "net name, component name, pin number, connected component". For example, for the fifth connected component on the component pin IMON 306, P12V_HOTSWAP_IMON is net name, PU1 is component name, 22 is pin number, and "MP5023GV00ABZ-MP5023GV-00AB-Z,A" is a connected component. Similarly, for the first connected component on the component pin IMON 306, P12V_HOTSWAP_IMON is net name, PC10 is component name, 1 is pin number, and "Q_CAP_0402-0.1UF,25V,10%,X7R,CA" is a connected component.

Figure 4:
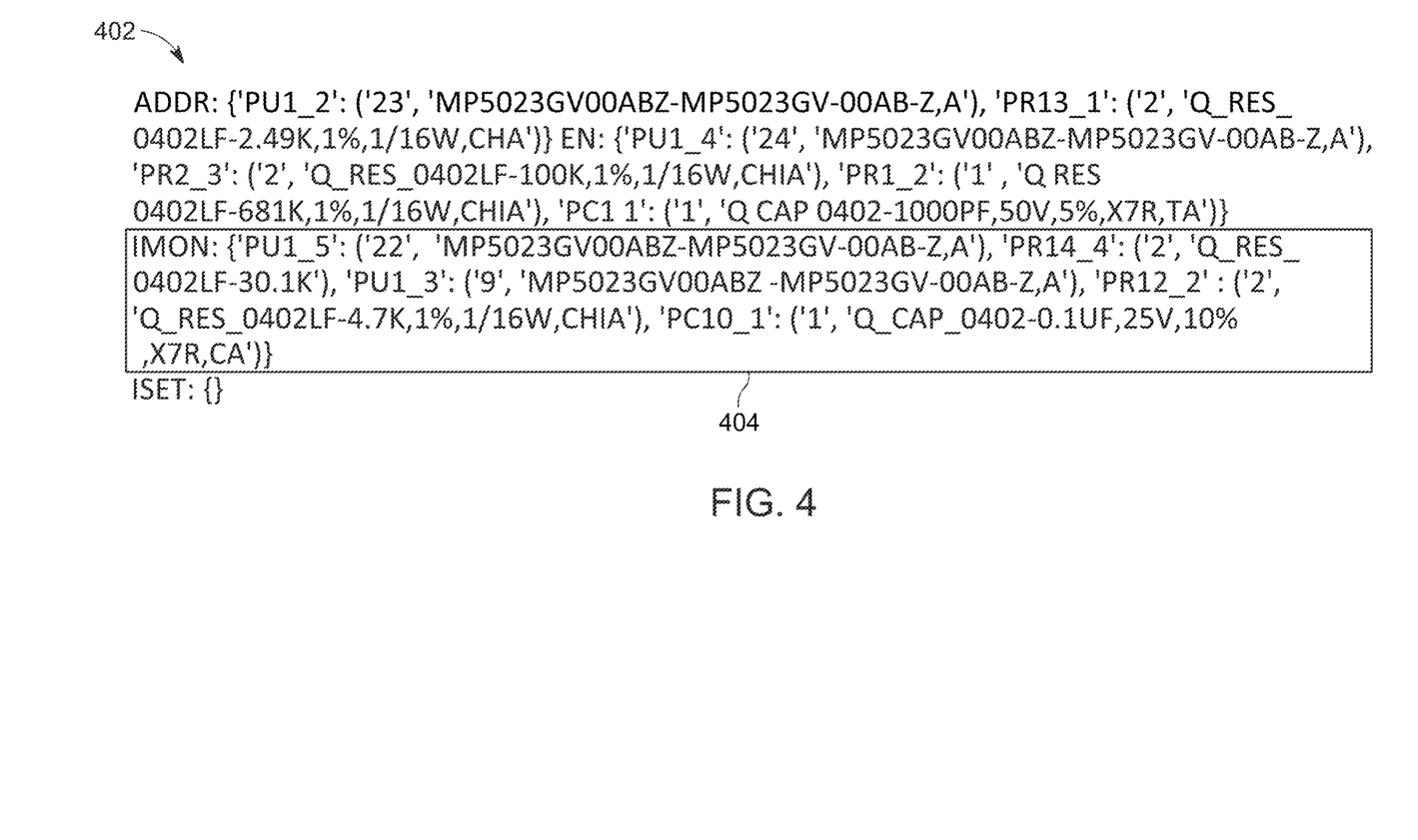
FIG. 4 illustrates a sorted netlist, according to certain aspects of the present disclosure.

FIG. 4 illustrates a sorted netlist 402 after performing sorting on the netlist file 304, according to step 204 (FIG. 2). For example, the component pin of interest IMON 306 (FIG. 3) is highlighted as component pin IMON 404. In the example of FIG. 4, sorting the netlist can result in a format: d={key1: (value1_1, value 1_2, ... ), key2: (value2_1, value 2_2, ... )}, or more specifically, "net name={'component name_line number': ('pin number', 'connected component, connected component pin label'), ... }", where "net name" is d, "component name_line number" is an example of a key, and "pin number" and "connected component" and "component pin label" are examples of values. For example, the component pin IMON 404 includes "IMON" as net name, "PU1_5" as "component name"_"line number", "22" as "pin number", and "MP5023GV00ABZ-MP5023GV-00AB-Z,A" is connected component. As can be seen between the netlist file 304 (FIG. 3) and the sorted netlist 402, the net name can be shortened (e.g., "P12V_HOTSWAP_IMON" is shortened to "IMON"). Furthermore, the component name can be annotated in order as seen in the netlist file 304 (e.g., "PU1" is annotated to "PU1_5").

Figure 5:
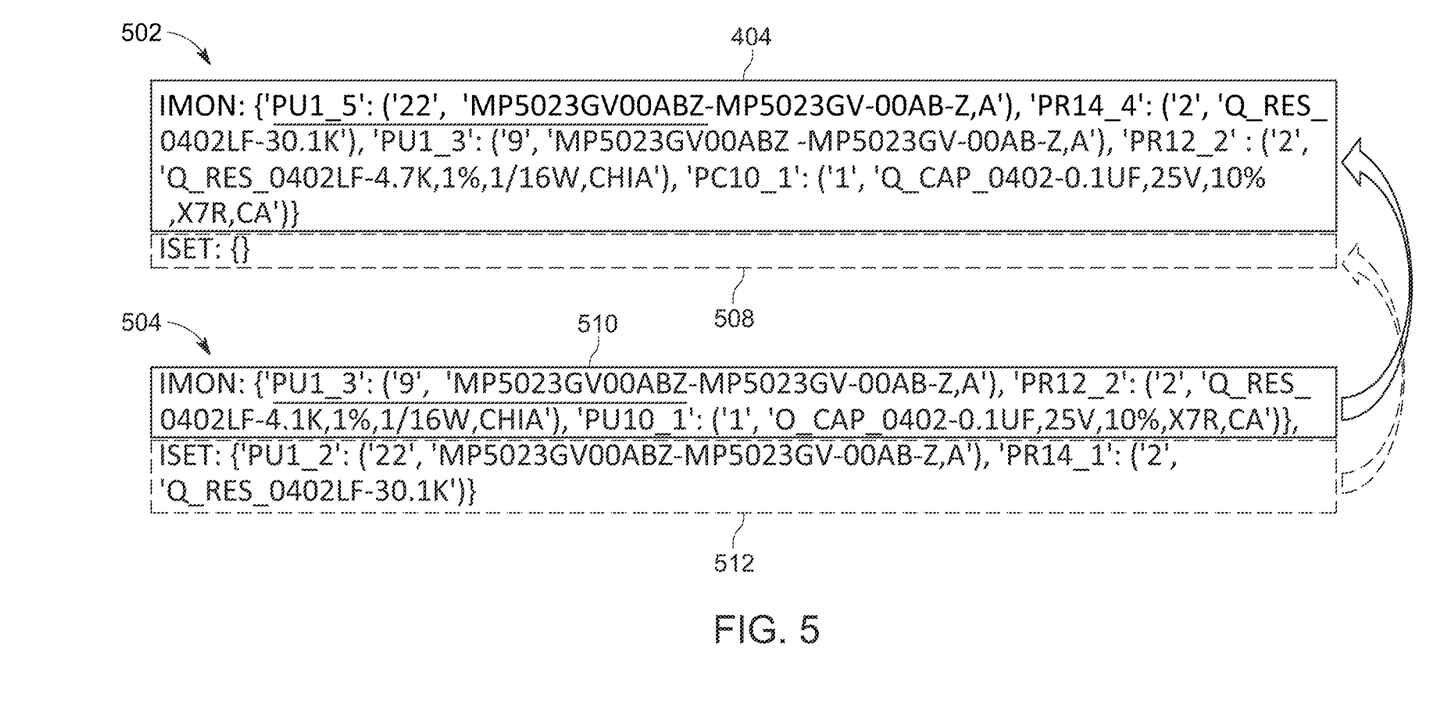
FIG. 5 illustrates comparing the sorted netlist of FIG. 4 with a reference netlist, according to certain aspects of the present disclosure.

FIG. 5 illustrates a partial netlist 502, i.e., a portion of the sorted netlist 402 (FIG. 4), and a reference netlist 504. Applying steps 206 (FIG. 2) and 208 (FIG. 2) involves comparing the partial netlist 502 to the reference netlist 504. The reference netlist 504 is obtained from the controller database 110. In the partial netlist 502, two component pins, IMON 404 and ISET 508, are highlighted. In the reference netlist 504, two component pins, reference IMON 510 and reference ISET 512, are highlighted.

In FIG. 5, the part number MP5023 is identified in both IMON 404 and reference IMON 510. The component net name, component specification, component description, component number of pins, and component numbers are checked. INION 404 is determined to be different from reference IMON 510, and ISET 508 is determined to be different from reference ISET 512. The number of components connected to IMON 404 is more than the number of components connected to reference IMON 510. ISET 508 has an empty set { } indicating no components are connected to the pin ISET 508, while reference ISET 512 has connected components. IMON 404 and ISET 508 thus differ from reference IMON 510 and reference ISET 512.

Figure 6:
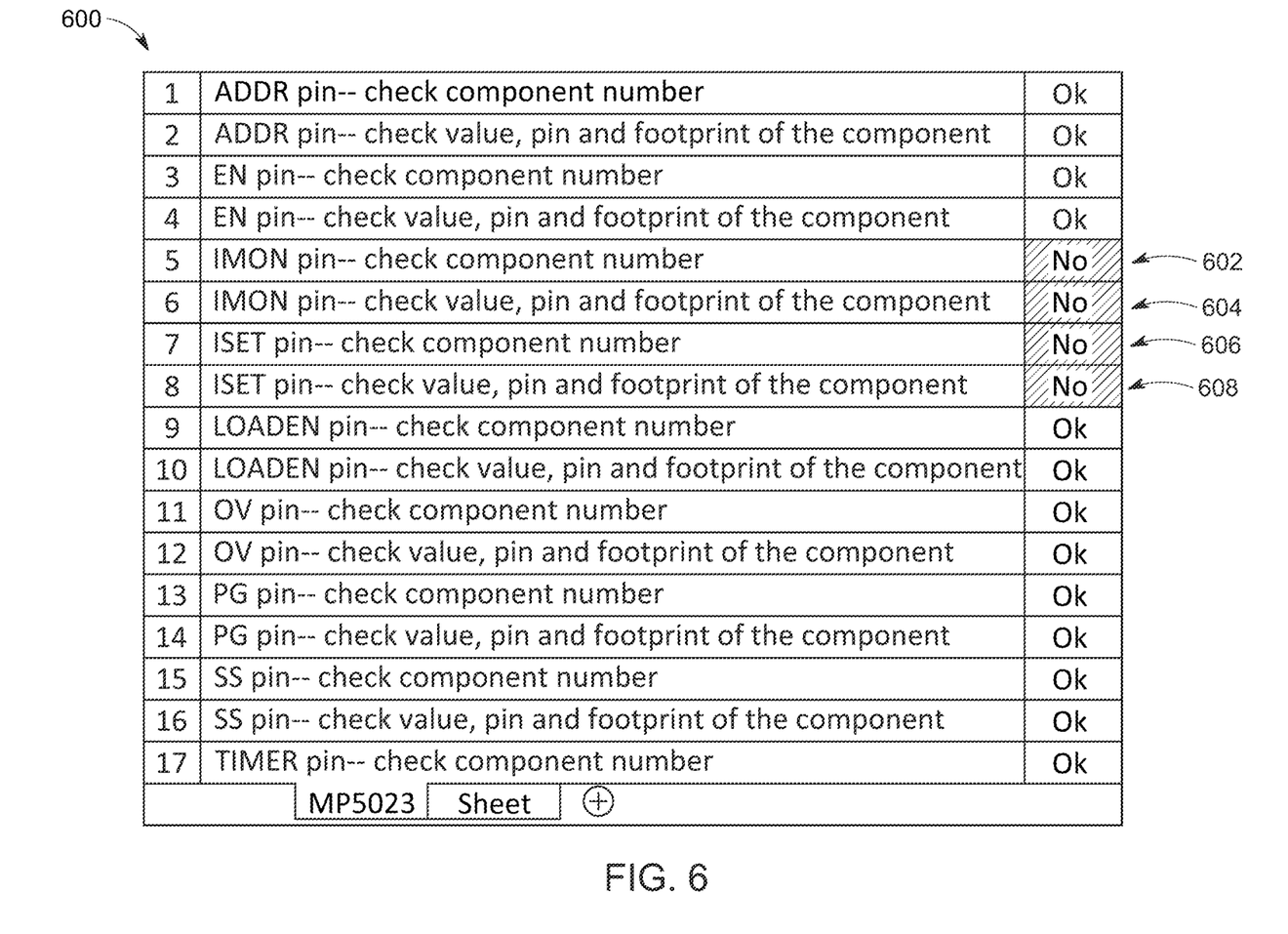
FIG. 6 illustrates displaying results of an automatic schematic check, according to certain aspects of the present disclosure.

FIG. 6 illustrates displayed results 600 with four errors 602, 604, 606, and 608 found in the sorted netlist 402 (FIG. 4). The error 602 indicates that the IMON pin has an error associated with number of components connected to the pin. The error 604 indicates that the IMON pin has an error associated with values (e.g., component names, etc.) of components connected to the IMON pin. The error 606 indicates that the ISET pin has an error associated with number of components connected to the ISET pin. The error 608 indicates that the ISET pin has errors associated with values of components connected to the ISET pin. The displayed results 600 show either a pass (Ok) or a failed (No) status.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A system, comprising:
   one or more data processors; and
   a non-transitory computer-readable storage medium containing instructions which, when executed on the one or more data processors, cause the one or more data processors to perform operations including:
   receiving a design schematic,
   extracting keywords from the design schematic, the extracted keywords including component pin names associated with a plurality of components in the design schematic,
   sorting the design schematic by the extracted keywords to obtain a sorted design schematic, the sorted design schematic including line number annotations to component names to associate a respective component in the sorted design schematic to an order of components in the received design schematic,
   extracting a part number of a component from the sorted design schematic,
   comparing the component associated with the part number with a reference component associated with the part number, and
   displaying a result of the comparison indicating whether the component and the reference component match.

2. The system of claim 1, wherein the design schematic is a netlist file.

3. The system of claim 2, wherein the extracted keywords further include component location, component specification, component description, component number of pins, or any combination thereof.

4. The system of claim 1, wherein the received design schematic is sorted by pin name.

5. The system of claim 1, wherein the result is displayed in a spreadsheet or a comma-separated values (CSV) file.

6. The system of claim 5, wherein the result includes a pass or failed status for each pin in the sorted design schematic.

7. A computer-implemented method, comprising:
   receiving a design schematic;
   extracting keywords from the design schematic, the extracted keywords including component pin names associated with a plurality of components in the design schematic;
   sorting the design schematic by the extracted keywords to obtain a sorted design schematic, the sorted design schematic including line number annotations to component names to associate a respective component in the sorted design schematic to an order of components in the received design schematic;
   extracting a part number of a component from the sorted design schematic;

comparing the component associated with the part number with a reference component associated with the part number; and displaying a result of the comparison indicating whether the component and the reference component match.

8. The method of claim 7, wherein the design schematic is a netlist file.

9. The method of claim 8, wherein the extracted keywords further include component net names, component location, component specification, component description, component number of pins, or any combination thereof.

10. The method of claim 7, wherein the received design schematic is sorted by pin name.

11. The method of claim 7, wherein the result is displayed in a spreadsheet or a comma-separated values (CSV) file.

12. The method of claim 11, wherein the result includes a pass or failed status for each pin in the sorted design schematic.

13. A computer-program product tangibly embodied in a non-transitory machine-readable storage medium, including instructions configured to cause a data processing apparatus to perform operations including:

receiving a design schematic;

extracting keywords from the design schematic, the extracted keywords including component pin names associated with a plurality of components in the design schematic;

sorting the design schematic by the extracted keywords to obtain a sorted design schematic, the sorted design schematic including line number annotations to component names to associate a respective component in the sorted design schematic to an order of components in the received design schematic;

extracting a part number of a component from the sorted design schematic;

comparing the component associated with the part number with a reference component associated with the part number; and displaying a result of the comparison indicating whether the component and the reference component match.

14. The computer-program product of claim 13, wherein the design schematic is a netlist file.

15. The computer-program product of claim 14, wherein the extracted keywords further include component net names, component location, component specification, component description, component number of pins, or any combination thereof.

16. The computer-program product of claim 13, wherein the received design schematic is sorted by pin name.

17. The computer-program product of claim 13, wherein the result is displayed in a spreadsheet or a comma-separated values (CSV) file.

18. The computer-program product of claim 17, wherein the result includes a pass or failed status for each pin in the sorted design schematic.

19. The system of claim 1, wherein the received netlist includes repetition of a first component pin name and the sorted netlist includes only one instance of the first component pin name.

20. The system of claim 19, wherein the only one instance of the first component pin name in the sorted netlist is an abbreviation of the first component pin name in the received netlist.

* * * * *